(12) United States Patent
Chang

(10) Patent No.: US 7,678,642 B2
(45) Date of Patent: Mar. 16, 2010

(54) METHOD FOR MANUFACTURING PHASE CHANGE MEMORY DEVICE USING A PATTERNING PROCESS

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 111 days.

(21) Appl. No.: 11/871,313

(22) Filed: Oct. 12, 2007

(65) Prior Publication Data
US 2008/0280411 A1    Nov. 13, 2008

(30) Foreign Application Priority Data
May 11, 2007    (KR) .................... 10-2007-0046136
Sep. 17, 2007   (KR) .................... 10-2007-0094366

(51) Int. Cl.
*H01L 23/485* (2006.01)
*H01L 21/8247* (2006.01)

(52) U.S. Cl. ............... 438/233; 438/523; 438/533; 438/669; 438/672; 438/720; 438/742; 438/902; 257/E29.116; 257/E29.119

(58) Field of Classification Search .......... 438/233, 438/523, 533, 669, 672, 720, 742, 902, FOR. 355; 257/E29.116, E29.119
See application file for complete search history.

(56) References Cited

U.S. PATENT DOCUMENTS

| 7,038,261 | B2* | 5/2006 | Horii ..................... 257/295 |
| 2003/0209746 | A1* | 11/2003 | Horii ..................... 257/295 |
| 2005/0127347 | A1* | 6/2005 | Choi et al. ................ 257/2 |
| 2006/0049447 | A1* | 3/2006 | Lee et al. ................ 257/314 |
| 2006/0175599 | A1* | 8/2006 | Happ ..................... 257/4 |
| 2006/0192232 | A1* | 8/2006 | Ando ..................... 257/288 |
| 2007/0057308 | A1* | 3/2007 | Min et al. ................ 257/314 |
| 2008/0121960 | A1* | 5/2008 | Ohuchi ................... 257/296 |
| 2009/0026618 | A1* | 1/2009 | Kim et al. ................ 257/751 |

FOREIGN PATENT DOCUMENTS

KR   2007-0011887 A   1/2007

* cited by examiner

*Primary Examiner*—George Fourson
(74) *Attorney, Agent, or Firm*—Ladas & Parry LLP

(57) ABSTRACT

A phase change memory device is made by processes including forming a first interlayer dielectric on a semiconductor substrate that has junction regions. Then etching the first interlayer dielectric and thereby defining contact holes that expose the junction regions. A conductive layer is formed on the first interlayer dielectric to fill the contact holes. Forming a hard mask layer on the conductive layer and etching the hard mask layer and the conductive layer to form contact plugs in the contact holes. Finally, forming a conductive layer pattern that is located on the contact plug and portions of the first interlayer dielectric adjacent to the contact plug and having a hard mask thereon.

11 Claims, 8 Drawing Sheets

METHOD FOR MANUFACTURING PHASE CHANGE MEMORY DEVICE USING A PATTERNING PROCESS

CROSS-REFERENCE TO RELATED APPLICATIONS

The present application claims priority to Korean patent application numbers 10-2007-0046136 filed on May 11, 2007 and 10-2007-0094366 filed on Sep. 17, 2007, which are incorporated herein by reference in its entirety.

BACKGROUND OF THE INVENTION

The present invention relates to a phase change memory device and a method for manufacturing the same, and more particularly, to a method for manufacturing a phase change memory device that simplifies a manufacturing procedure, thereby increasing a manufacturing yield and improving the characteristics of the phase change memory device.

Generally, memory devices can largely be categorized into a volatile RAM (random access memory) which loses inputted information when power is interrupted and a non-volatile ROM (read-only memory) which can continuously maintain the stored state of inputted information even when power is interrupted. Volatile RAM may include DRAM (dynamic RAM) and SRAM (static RAM) and non-volatile ROM may include a flash memory device such as an EEPROM (electrically erasable and programmable ROM).

It is well known that DRAM is an excellent memory device, however DRAM requires a high charge storing capacity and since the surface area of an electrode must be increased, it is difficult to accomplish a high level of integration. Further, flash memory stacks two gates on one another requiring a high operation voltage when compared to a source voltage. Accordingly, since a separate booster circuit is needed to form the necessary voltage for write and delete operations, it is difficult to obtain a high level of integration.

Research to develop a novel memory device having a simple configuration and capable of accomplishing a high level of integration while retaining the characteristics of non-volatile memory has been made. For example, a phase change memory device has recently been disclosed in the art.

In a phase change memory device, a phase change occurs in a phase change layer interposed between a lower electrode and an upper electrode. The phase change layer changes from a crystalline state to an amorphous state due to current flow between the lower electrode and the upper electrode. The information stored in a cell is determined by the medium difference in resistance between the crystalline state and the amorphous state.

In detail, in a phase change memory device, a chalcogenide layer being a compound layer made of germanium (Ge), stibium (Sb) and tellurium (Te) is employed as a phase change layer. As a current is applied, the phase change layer undergoes a phase change by heat, e.g. Joule heat, between the amorphous state and the crystalline state. Accordingly, in the phase change memory device, the specific resistance of the phase change layer in the amorphous state is higher than the specific resistance of the phase change layer in the crystalline state. In a read mode, sensing the current flowing through the phase change layer determines whether the information stored in a phase change cell has a logic value of '1' or '0'.

In the phase change memory device, the conversion from a crystalline state to an amorphous state is called 'reset'. Conversely, the conversion from an amorphous state to a crystalline state is called 'set'. In terms of power consumption and operation speed, it is beneficial to utilize a low current for a reset and set (programming). Accordingly, by decreasing the contact area as much as possible between a phase change layer and a lower electrode, a current density can be increased and a required current can be decreased at an interface between two materials.

To achieve this in the conventional art, the lower electrode is formed in the shape of a plug in an effort to decrease the contact area between a lower electrode and a phase change layer.

Hereafter, a conventional phase change memory device will be schematically explained.

A first interlayer dielectric is formed on a semiconductor substrate having a gate line and source and drain regions. Contact plugs are formed in portions of the first interlayer dielectric corresponding to a region in which a phase change cell is to be formed and a region in which a line to be applied with a ground voltage (hereinafter, referred to as a "Vss line") is to be formed such that the contact plugs respectively come into contact with the drain region and the source region.

An insulation layer is formed on the first interlayer dielectric including the contact plugs. A dot type pad is formed in the portion of the insulation layer that corresponds to the phase change cell forming region to contact the contact plug. A bar type Vss line is formed in the portion of the insulation layer that corresponds to the region having a ground voltage to contact the contact plug.

A second interlayer dielectric is formed on the insulation layer including the pad and the Vss line. A plug-shaped lower electrode is formed in the second interlayer dielectric to contact the pad. Further, a phase change layer and an upper electrode are sequentially formed on the lower electrode and on portions of the second interlayer dielectric adjacent to the lower electrode to form a phase change cell.

However, in the conventional art, the pad and the Vss line are formed through a damascene process. Manufacturing yield of the phase change memory device is decreased due to the damascene process being complicated and having a high processing cost.

Also, the characteristics of the phase change memory device can be deteriorated where the pad and the Vss line are formed as a tungsten layer through the damascene process because seams are likely to be formed in the tungsten layer.

SUMMARY OF THE INVENTION

Embodiments of the present invention are directed to a phase change memory device which simplifies a manufacturing procedure, thereby increasing a manufacturing yield and improving the characteristics of the phase change memory device, and a method for manufacturing the same.

In one aspect, a method for manufacturing a phase change memory device comprises the steps of forming a first interlayer dielectric on a semiconductor substrate which has junction regions; etching the first interlayer dielectric and thereby defining contact holes which expose the junction regions; forming a conductive layer on the first interlayer dielectric to fill the contact holes; forming a hard mask layer on the conductive layer; and etching the hard mask layer and the conductive layer, and thereby forming contact plugs in the contact holes and forming a conductive layer pattern which is located on the contact plug and portions of the first interlayer dielectric adjacent to the contact plug and has a hard mask thereon.

The contact plug and the conductive layer pattern are integrally formed with each other.

The contact plug and the conductive layer pattern are formed of tungsten or aluminum.

The conductive layer pattern is a pad.

The hard mask is made of a nitride layer.

After the step of forming the contact plugs and the conductive layer pattern having the hard mask thereon, the method further comprises the steps of forming a second interlayer dielectric on the first interlayer dielectric including the hard mask and the conductive layer pattern, to expose the hard mask; forming an insulation layer on the hard mask and the second interlayer dielectric; etching the insulation layer and the hard mask and thereby defining a hole which exposes the conductive layer pattern; forming a lower electrode in the hole to come into contact with the conductive layer pattern; and forming a phase change layer and an upper electrode on the lower electrode and the insulation layer.

The second interlayer dielectric is formed as a double layer including a conformal insulation layer and a planarizing insulation layer.

The insulation layer is made of a nitride layer.

The lower electrode is made of any one of TiAlN, TiW and TiN layers.

Between the step of defining the hole and the step of forming the lower electrode, the method comprises the step of forming insulation layer spacers on sidewalls of the hole.

The insulation layer spacers are made of a nitride layer or an oxide layer.

The step of forming the phase change layer and the upper electrode is implemented in a manner such that the insulation layer is etched together.

DESCRIPTION OF SPECIFIC EMBODIMENTS

In the present invention, a pad including a contact plug is formed using a patterning process instead of a damascene process as in the conventional art. Further, in the present invention, an insulation layer made of a nitride layer is formed between a lower electrode and a phase change layer.

Accordingly, in the present invention, the manufacturing yield of a phase change memory device can be increased and the manufacturing cost reduced through simplifying the process for forming the pad including the contact plug. Also, in the present invention, it is possible to prevent seams from being formed because the damascene process is not used. Therefore, the characteristics of the phase change memory device can be improved because the interface between the pad and the lower electrode can be stabilized.

Hereafter, the present invention will be descried in detail with reference to the attached drawings.

Figure 1:
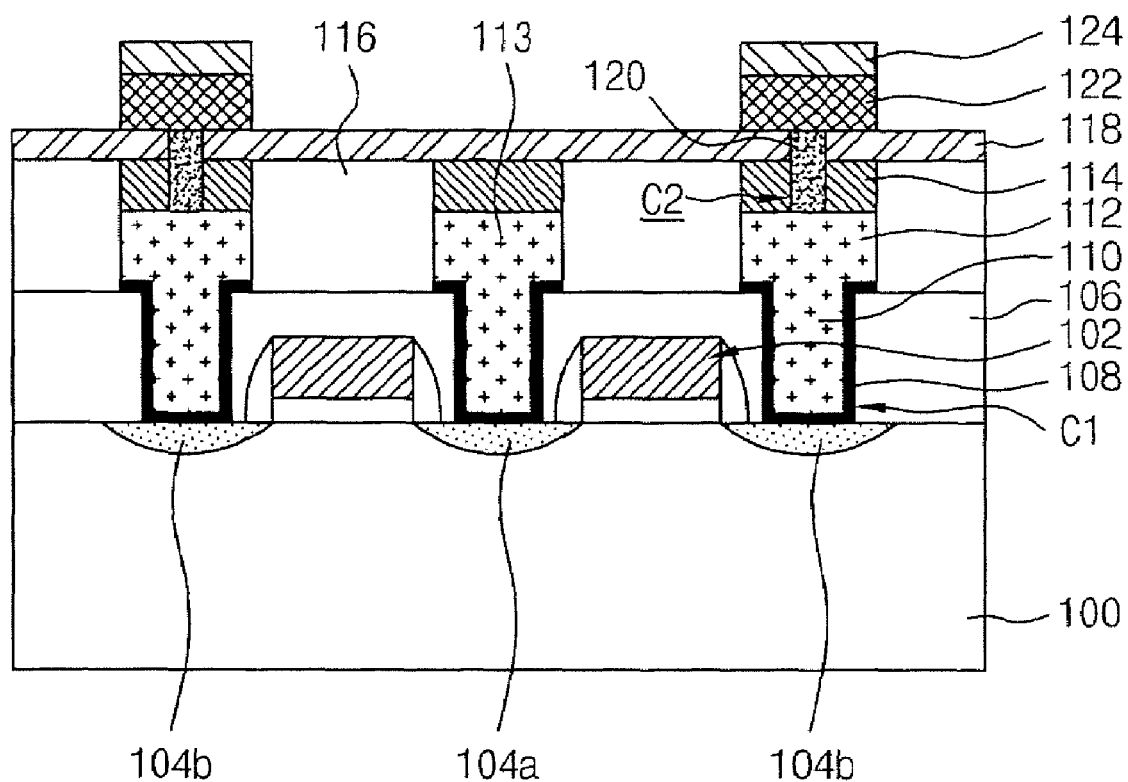
FIG. 1 is a cross-sectional view illustrating a phase change memory device in accordance with a first embodiment of the present invention.

FIG. 1 is a cross-sectional view illustrating a phase change memory device in accordance with a first embodiment of the present invention.

Referring to FIG. 1, a semiconductor substrate 100 is formed with a transistor that includes a gate 102 and source and drain regions 104a and 104b. A first interlayer dielectric 106 is formed on the semiconductor substrate 100 to cover the transistor. Contact plugs 110 are formed in the first interlayer dielectric 106 to contact the source and drain regions 104a and 104b of the semiconductor substrate 100. A conductive layer pattern, e.g. a pad 112, is formed on the contact plug 110 and on the portions of the first interlayer dielectric 106 which are adjacent to the contact plug 110.

The contact plug 110 and the pad 112 are integrally formed with each other. A hard mask 114 is located on the pad 112. In particular, the pad 112 including the contact plug 110 is formed through a patterning process using the hard mask 114 as an etch mask.

The pad 112 is formed as a dot type in a phase change cell forming region. A Vss line 113 and the pad 112 is formed into a bar type in a region where a ground voltage is to be applied.

A lower electrode 120 is then formed within the hard mask 114 on the pad 112 in the shape of a plug to contact the pad 112. The lower electrode 120 is made of any one of TiAlN, TiW and TiN layers. A phase change layer 122 is subsequently formed on the lower electrode 120 and an upper electrode 124 is formed on the phase change layer 122 to form a phase change cell. The phase change layer 122 is formed of at least one chalcogenide material from a group consisting of germanium (Ge), stibium (Sb) and tellurium (Te).

In the phase change memory device according to the present invention, an insulation layer 118 is interposed between the hard mask 114 and the phase change layer 122. Preferably, the insulation layer 118 is a nitride layer and is formed on an entire second interlayer dielectric 116 including the hard mask 114.

In FIG. 1, reference numeral C1 designates a contact hole, 108 a barrier layer, and C2 a hole for a lower electrode.

FIGS. 2A through 2I are cross-sectional views illustrating the processes of a method for manufacturing the phase change memory device in accordance with the first embodiment of the present invention.

Figure 2A:
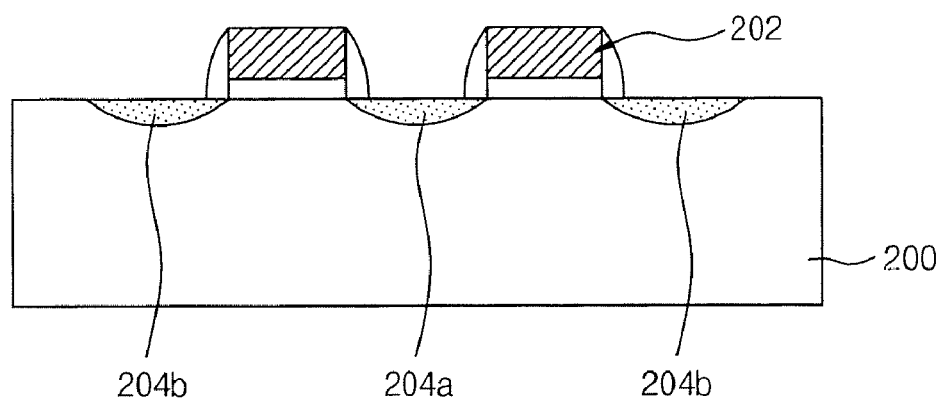
FIGS. 2A through 2I are cross-sectional views illustrating the processes of a method for manufacturing the phase change memory device in accordance with the first embodiment of the present invention.

Referring to FIG. 2A, a gate 202 is formed in the active region of a semiconductor substrate 200 that is delimited by an isolation structure (not shown). Junction regions such as a source region 204a and a drain region 204b are then formed in the surface of the semiconductor substrate 200 on both sides of the gate 202 through ion implantation to form a transistor.

Figure 2B:
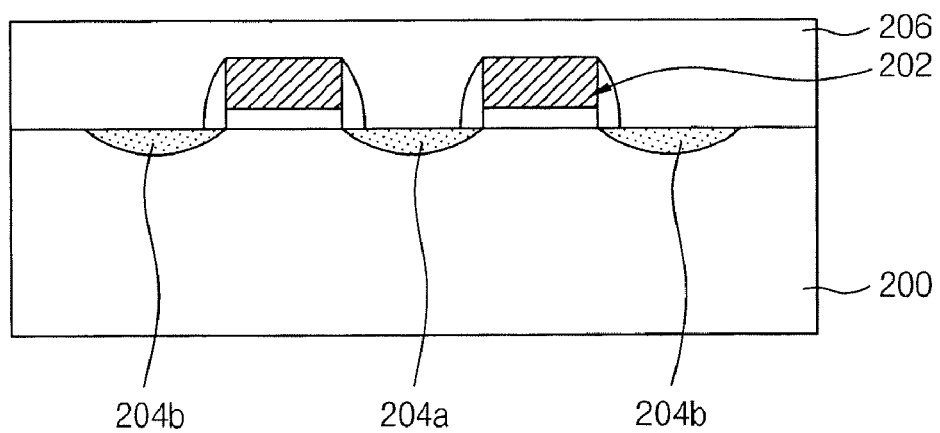

Referring to FIG. 2B, a first interlayer dielectric 206 is deposited on the semiconductor substrate 200 to cover the gate 202, the semiconductor substrate 200 and the source and drain regions 204a and 204b. The surface of the first interlayer dielectric 206 is then planarized.

Figure 2C:
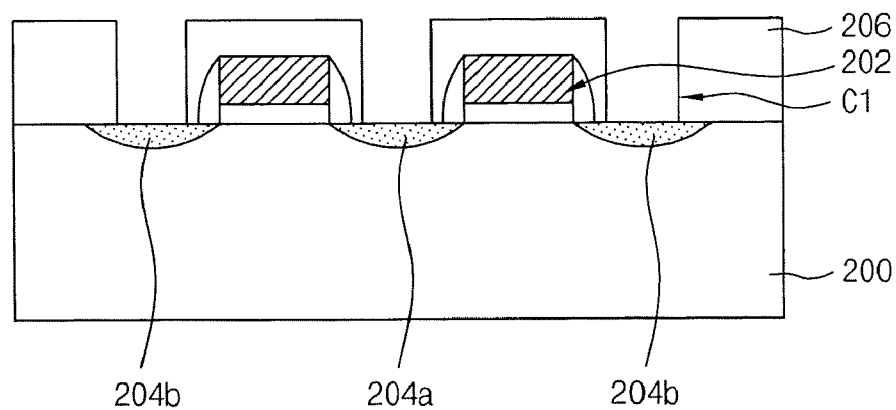

Referring to FIG. 2C, contact holes C1 are formed by etching the first interlayer dielectric 206 to expose the source and drain regions 204a, 204b that are formed in the semiconductor substrate 200.

Figure 2D:
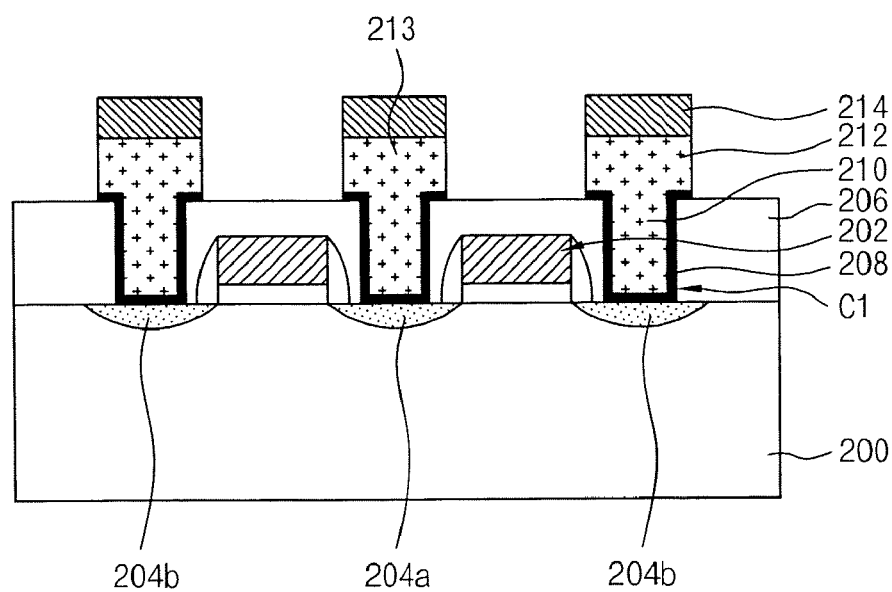

Referring to FIG. 2D, a barrier layer 208 is formed on the first interlayer dielectric 206 and the surfaces of the contact holes C1. A conductive layer on the barrier layer 208 is then formed to fill the contact holes C1 and a hard mask layer is formed on the conductive layer. The conductive layer is made of a metallic layer formed of tungsten or aluminum and the hard mask layer is made of a nitride layer.

Etching the hard mask layer forms a hard mask 214. Using the hard mask 214 as an etch mask, the conductive layer and the barrier layer 208 placed thereunder is etched to form contact plugs 210 in the contact holes C1. A conductive layer pattern, e.g. a pad 212, is formed on the contact plug 210 and on the portions of the first interlayer dielectric 206 which are adjacent to the contact plug 210 to be electrically connected with the drain region 204b of the semiconductor substrate 200 via the contact plug 210. The pad 212 is a dot type where formed in a phase change cell region and is integrally formed with the contact plug 210.

When forming the pad 212 including the contact plug 210, a Vss line 213 is formed into a bar type in a region where a ground voltage is to be applied to contact the source region 204a via the contact plug 210. The bar type Vss line 213 is formed parallel to the gate 202.

Accordingly, in the present invention, the manufacturing yield of a phase change memory device can be increased and the manufacturing cost thereof can be reduced because the patterning process to form pad 212 including the contact plug 210 is simplified as compared to the conventional art in which a damascene process is used to form the pad.

Figure 2E:
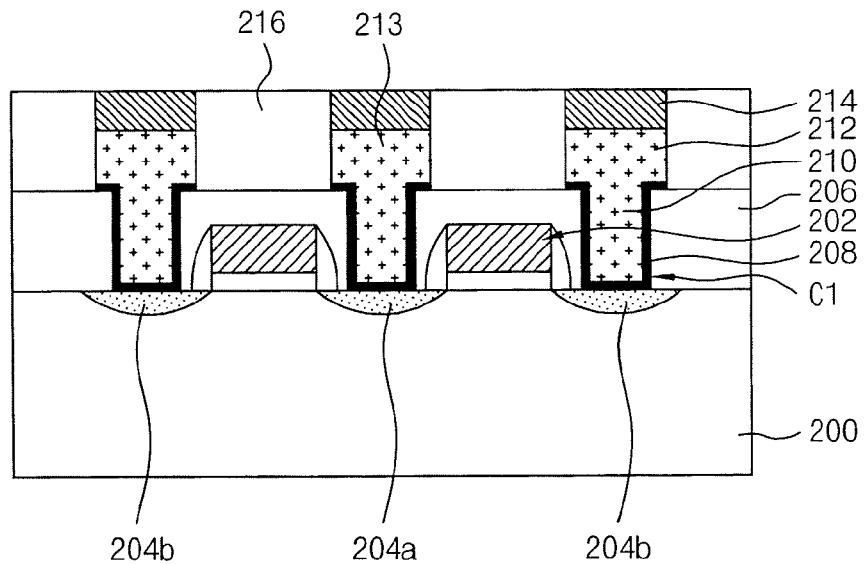

Referring to FIG. 2E, a second interlayer dielectric 216 is deposited on the first interlayer dielectric 206 to cover the pad 212 having the hard mask 214 thereon and is subsequently planarized. Preferably, the second interlayer dielectric 216 is formed as a double layer including a conformal insulation layer and a planarizing insulation layer. The planarization is performed by CMPing (chemically and mechanically polishing) the planarizing insulation layer until the hard mask 214 on the pad 212 is exposed. CMPing is conducted using slurry that has a high selectivity in regards to the hard mask 214 nitride layer.

Figure 2F:
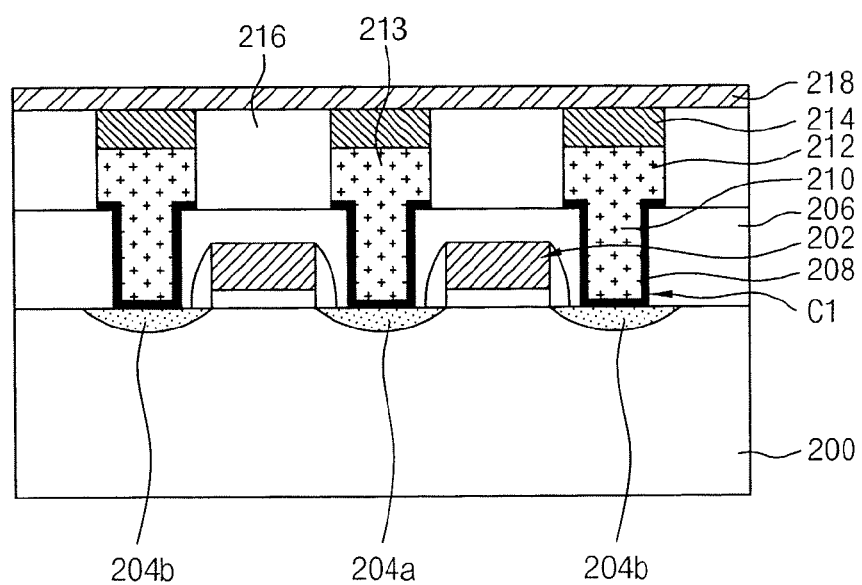

Referring to FIG. 2F, an insulation layer 218 made of a nitride layer is formed on the second interlayer dielectric 216 including the hard mask 214. The insulation layer 218 prevents heat from being dissipated when transferring heat from a lower electrode subsequently formed to a phase change layer subsequently formed on the lower electrode. The insulation layer 218 thereby stabilizes the characteristics of the interface between the phase change layer and the lower electrode.

Figure 2G:
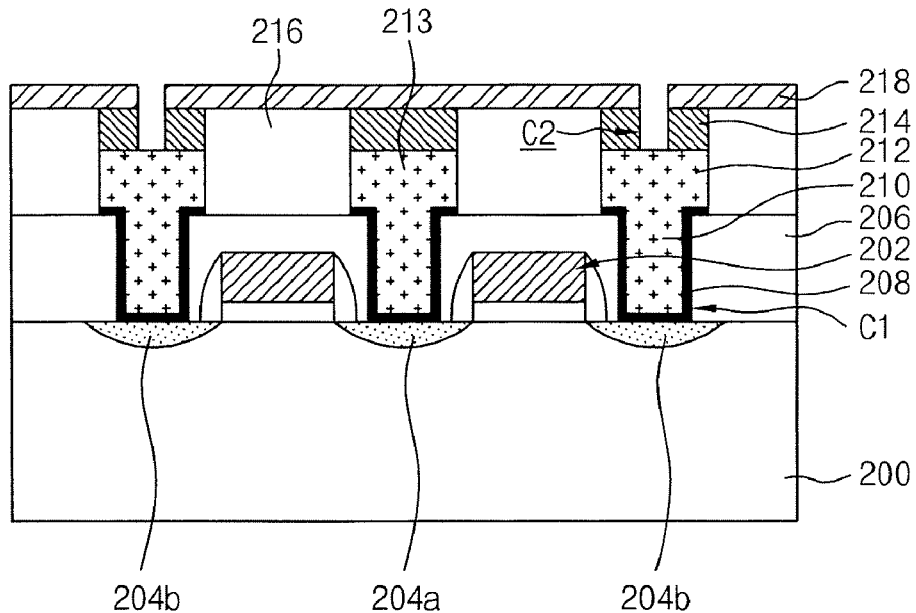

Referring to FIG. 2G, a hole C2 for a lower electrode is formed by etching the insulation layer 218 and the hard mask 214 to expose the pad 212 that is electrically connected with the drain region 204b. The hole C2 for a lower electrode is less than 100 nm in size, preferably 50~100 nm, so as to minimize the contact area with the phase change layer subsequently formed.

Figure 2H:
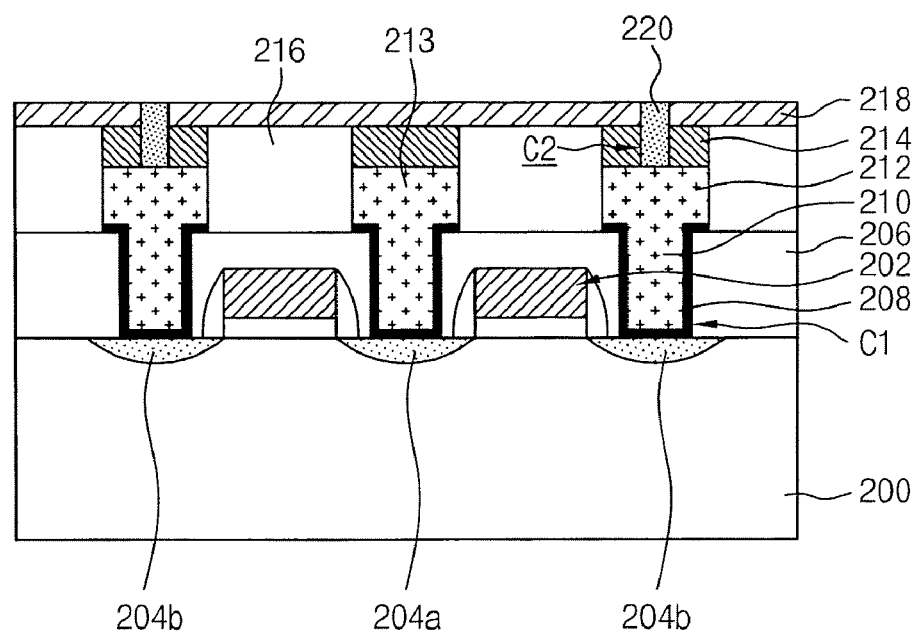

Referring to FIG. 2H, a lower electrode 220 is formed within the hole C2 for a lower electrode to contact the pad 212. The lower electrode 220 is made of a layer which has low reactivity to the phase change layer subsequently formed. For example, the layer may be any one of TiAlN, TiW and TiN layers.

Figure 2I:
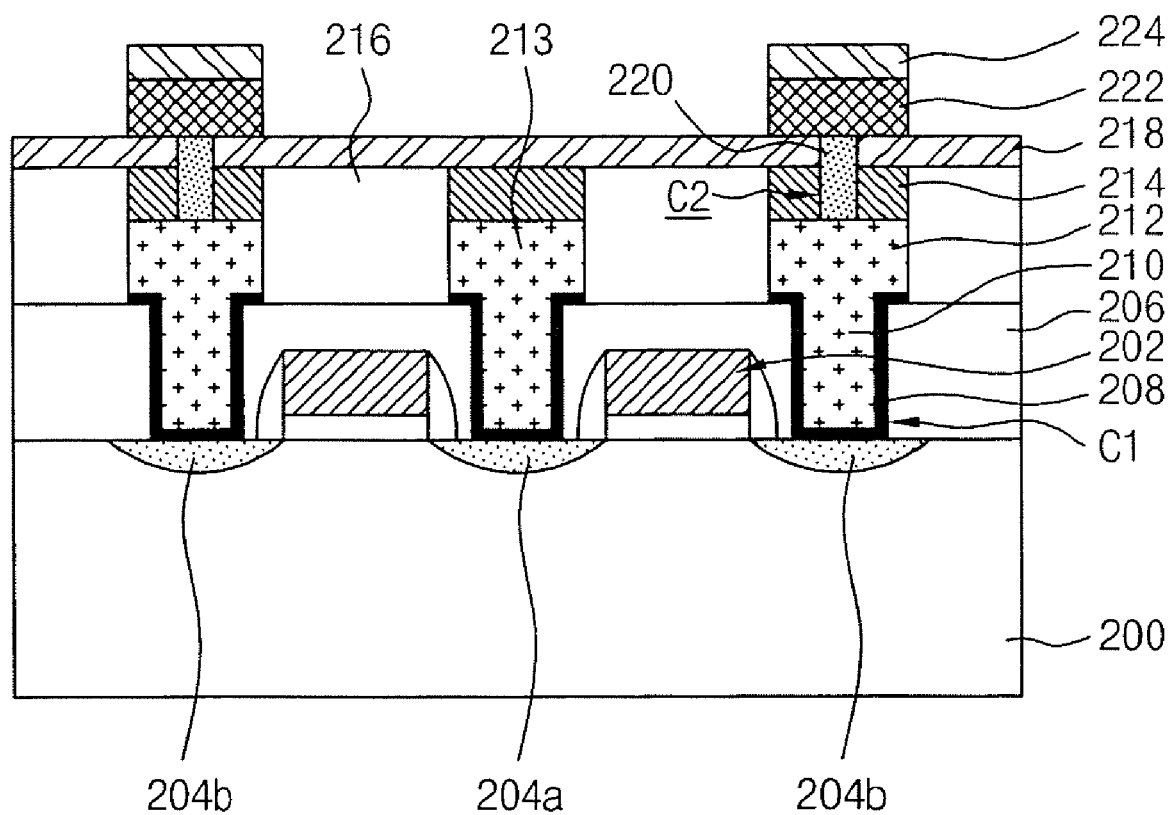

Referring to FIG. 2I, a phase change material layer and a layer for an upper electrode are sequentially deposited on the insulation layer 218 including the lower electrode 220. The phase change material layer is formed of at least one chalcogenide material from a group consisting of germanium (Ge), stibium (Sb) and tellurium (Te). It is possible to dope oxygen, nitrogen, silicon, etc. into the chalcogenide materials. Preferably, the layer for an upper electrode is formed of the same material as the lower electrode 220.

A phase change layer 222 and an upper electrode 224 are sequentially formed on the lower electrode 220 and on the portions of the insulation layer 218 which are adjacent to the lower electrode 220 by etching the layer for an upper electrode and the phase change material layer using the insulation layer 218 as an etch stop layer.

Thereafter, the manufacture of the phase change memory device according to the first embodiment of the present invention is completed by sequentially conducting a series of subsequent well-known processes (not shown) including a process for forming bit lines to contact the upper electrode 224.

As described above in the present invention, the manufacturing yield of a phase change memory device can be increased and the manufacturing cost thereof can be reduced by simplifying the pad forming procedure since the pad including the contact plug is formed using a patterning process instead of a damascene process.

Additionally, where the damascene process is used, seams are likely to be formed on the surface of the pad. In contrast, where the patterning process is used, no seam is formed on the surface of the pad. Therefore, in the present invention, the phase change memory device characteristics can be improved.

Also, the interface between the lower electrode and the phase change layer can be stabilized because the insulation layer made of a nitride layer is formed between the hard mask and the phase change layer, whereby the characteristics of the phase change memory device can be further improved.

Figure 3:
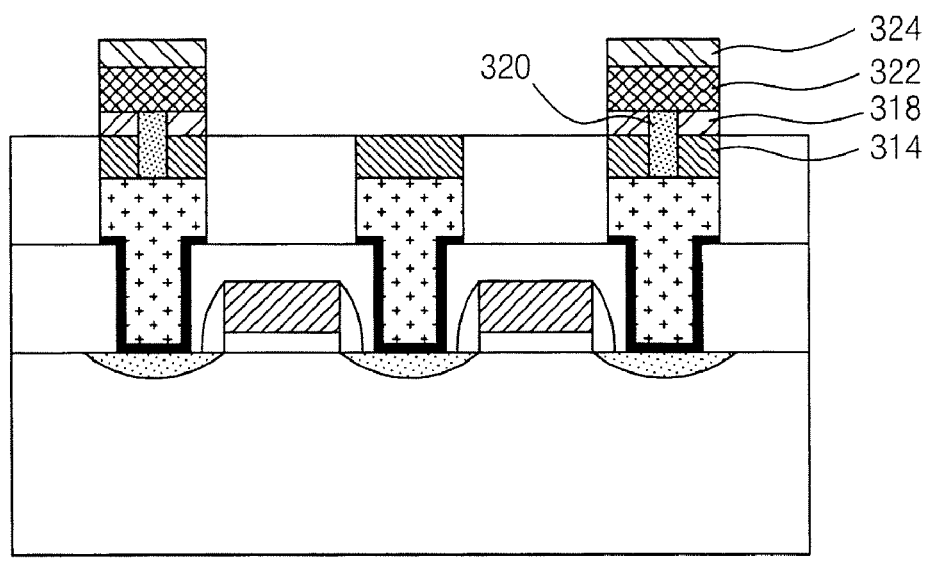
FIG. 3 is a cross-sectional view illustrating a phase change memory device in accordance with a second embodiment of the present invention.

FIG. 3 is a cross-sectional view illustrating a phase change memory device in accordance with a second embodiment of the present invention.

Referring to FIG. 3, in the phase change memory device according to a second embodiment of the present invention, an insulation layer made of a nitride layer is formed only on a hard mask 314 as compared to that of the first embodiment. That is to say, in the phase change memory device according to the second embodiment, when forming an upper electrode 324 and a phase change layer 322, an insulation layer 318 is also etched. Therefore, in the second embodiment, the insulation layer 318 does not serve as an etch stop layer when etching a layer for an upper electrode and a phase change material layer, but is etched together with these layers. Reference numeral 320 designates a lower electrode.

The phase change memory device according to the second embodiment of the present invention is formed by conducting the remaining processes in the same manner as those of the first embodiment, excluding the process for etching the insulation layer.

Figure 4:
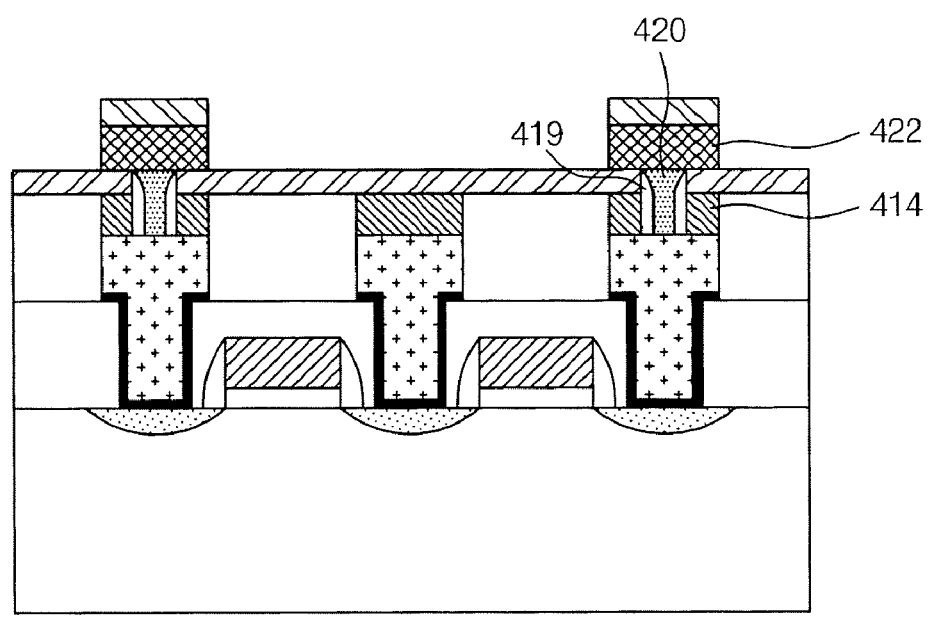
FIG. 4 is a cross-sectional view illustrating a phase change memory device in accordance with a third embodiment of the present invention.

FIG. 4 is a cross-sectional view illustrating a phase change memory device in accordance with a third embodiment of the present invention.

Referring to FIG. 4, in the phase change memory device according to the third embodiment of the present invention, insulation layer spacers 419 are interposed between a hard mask 414 and a lower electrode 420 as compared to that of the first embodiment. The insulation layer spacers 419 are made of an oxide layer or a nitride layer. The insulation layer spacers 419 decrease the contact area between the lower electrode 420 and a phase change layer 422.

The phase change memory device according to the third embodiment of the present invention is formed by conducting the remaining processes in the same manner as those of the first embodiment, excluding the process for forming the insulation layer spacers 419.

Figure 5:
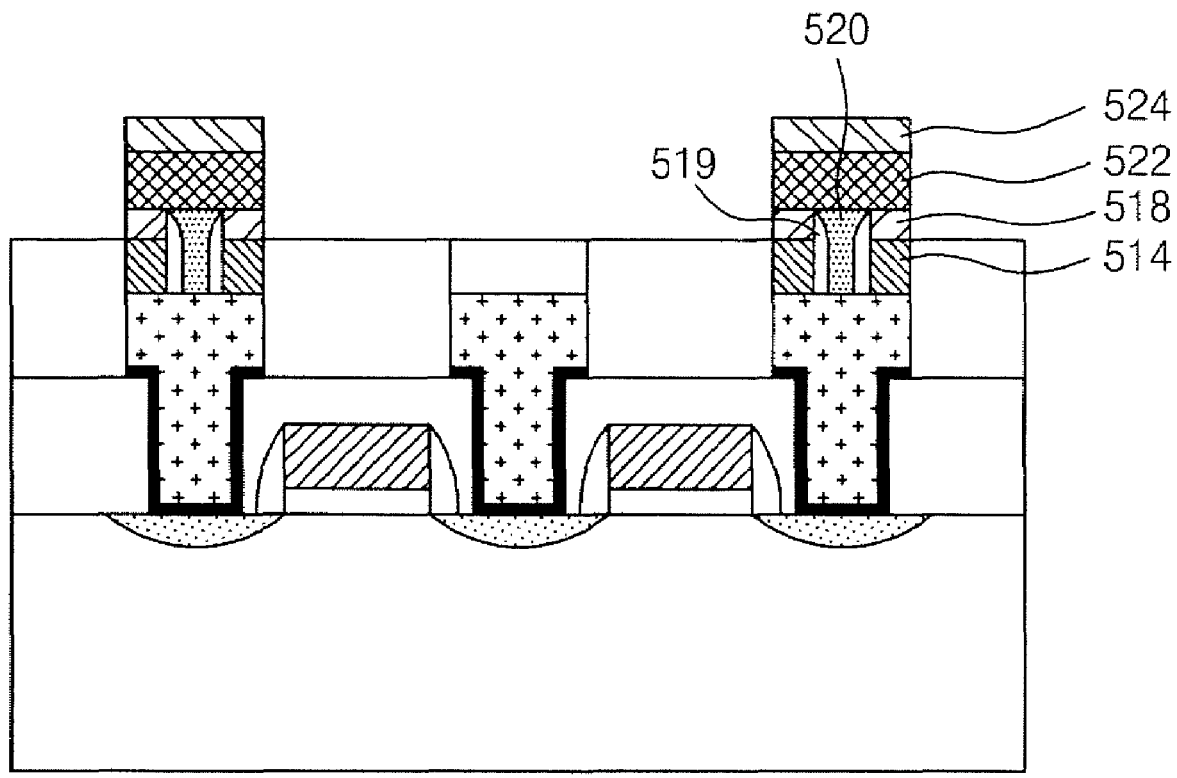
FIG. 5 is a cross-sectional view illustrating a phase change memory device in accordance with a fourth embodiment of the present invention.

FIG. 5 is a cross-sectional view illustrating a phase change memory device in accordance with a fourth embodiment of the present invention.

Referring to FIG. 5, in the phase change memory device according to the fourth embodiment of the present invention, an insulation layer 518 does not serve as an etch stop layer when etching a phase change layer 522 and an upper electrode 524 as compared to that of the first embodiment. Rather, insulation layer 518 is etched together with these layers and is left only on the hard mask 514. Further, insulation layer spacers 519 are interposed between the hard mask 514 and a lower electrode 520 as compared to that of the first embodiment. The insulation layer spacers 519 are made of an oxide layer or a nitride layer. The insulation layer spacers 519 decrease the contact area between the lower electrode 520 and the phase change layer 522.

The phase change memory device according to the fourth embodiment of the present invention is formed by conducting the remaining processes in the same manner as those of the first embodiment, excluding the processes for etching the insulation layer 518 and forming the insulation layer spacers 519.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change RAM, comprising the steps of:
    forming a first interlayer dielectric on a semiconductor substrate which has junction regions;
    etching the first interlayer dielectric and thereby defining contact holes which expose the junction regions;
    forming a conductive layer on the first interlayer dielectric to fill the contact holes;
    forming a hard mask layer on the conductive layer; and
    etching the hard mask layer and the conductive layer together, and thereby forming contact plugs in the contact holes and forming a conductive layer pattern which is located on the contact plug and portions of the first interlayer dielectric adjacent to the contact plug and has a hard mask thereon;
    wherein the contact plug and the conductive layer pattern are formed through a single etching process, so that the contact plug and the conductive layer pattern are integrally formed with each other.

2. The method according to claim 1, wherein the contact plug and the conductive layer pattern are formed of tungsten or aluminum.

3. The method according to claim 1, wherein the conductive layer pattern is a pad.

4. The method according to claim 1, wherein the hard mask is made of a nitride layer.

5. The method according to claim 1, wherein, after the step of forming the contact plugs and the conductive layer pattern having the hard mask thereon, the method further comprises the steps of:
    forming a second interlayer dielectric on the first interlayer dielectric including the hard mask and the conductive layer pattern, to expose the hard mask;
    forming an insulation layer on the hard mask and the second interlayer dielectric;
    etching the insulation layer and the hard mask and thereby defining a hole which exposes the conductive layer pattern;
    forming a lower electrode in the hole to come into contact with the conductive layer pattern; and
    forming a phase change layer and an upper electrode on the lower electrode and the insulation layer.

6. The method according to claim 5, wherein the second interlayer dielectric is formed as a double layer including a conformal insulation layer and a planarizing insulation layer.

7. The method according to claim 5, wherein the insulation layer is made of a nitride layer.

8. The method according to claim 5, wherein the lower electrode is made of any one of TiAlN, TiW and TiN layers.

9. The method according to claim 5, wherein, between the step of defining the hole and the step of forming the lower electrode, the method comprises the step of:
    forming insulation layer spacers on sidewalls of the hole.

10. The method according to claim 9, wherein the insulation layer spacers are made of a nitride layer or an oxide layer.

11. The method according to claim 5, wherein the insulation layer IS etched when the phase change layer and the upper electrode are formed, so that the insulation layer, the phase change layer and the upper electrode have a same width as each other.

* * * * *